United States Patent [19]

Piazza

[11] 4,254,163
[45] Mar. 3, 1981

[54] STRIPPABLE RESISTS

[75] Inventor: John R. Piazza, East Amwell Township, Hunterdon County, N.J.

[73] Assignee: Western Electric Company, Inc., New York, N.Y.

[21] Appl. No.: 29,951

[22] Filed: Apr. 13, 1979

[51] Int. Cl.³ .............................................. C23F 1/02
[52] U.S. Cl. ................................ 427/96; 101/401.1; 106/32; 156/668; 156/901; 156/904; 156/659.1; 228/118; 228/180 R; 427/98; 427/195; 427/202; 427/259
[58] Field of Search ................... 427/96, 98, 195, 202, 427/259; 106/32; 101/401.1; 156/659.1, 668, 901, 904; 228/118, 180 R

[56] References Cited

U.S. PATENT DOCUMENTS

| | | | |
|---|---|---|---|
| 2,110,219 | 3/1938 | Green et al. | 101/426 |
| 3,640,219 | 2/1972 | Farnham et al. | 101/401.1 |
| 3,854,973 | 12/1974 | Meesereau | 427/98 |
| 3,911,160 | 10/1975 | Neuberg | 101/426 |
| 4,073,981 | 2/1978 | Baron | 427/259 |
| 4,145,460 | 3/1979 | Finley et al. | 427/195 |
| 4,157,936 | 6/1979 | Piazza | 427/96 |

OTHER PUBLICATIONS

Hercules Incorporated Product Data Sheet No. 7167-3.
Hercules Incorporated Product Data Sheet No. 7166-2.
"Piccolastic" published by Pennsylvania Industrial Chem. Corp.

*Primary Examiner*—John D. Smith
*Attorney, Agent, or Firm*—J. F. Spivak

[57] ABSTRACT

A printed circuit board is formed from a metal-clad substrate by applying a solvent-free, non-dryable ink in a predetermined pattern on the substrate, dusting powdered resin over the surface, removing any resin powder not retained by the ink from the surface, heating the substrate having the ink powder thereon to a temperature so as to fuse the powdered resin to form a strippable resist, etching the uncoated portion of the metal laminate and stripping the resist subsequent to etching.

34 Claims, No Drawings

STRIPPABLE RESISTS

TECHNICAL FIELD

This invention relates to strippable resists and more particularly, to strippable resin resists modified with compatible resin powders for thermographic printing and methods for rendering a pattern on a surface using such resists.

BACKGROUND OF THE INVENTION

Thermographic printing is an imaging process in which powdered resins are retained on a substrate by previously printed wet ink. Typically, the wet ink is either a solvent-containing ink wherein the solvent is capable of dissolving the powdered resin and wherein the ink, by itself, is capable of drying to form a permanent dry film on the substrate when the solvent is removed or a drying oil or oil modified alkyd which is capable of self drying by oxygen absorption and polymerization. The overall thermographic process includes printing the ink, applying powder resins over the ink, removing powder not retained by the ink, and baking or curing to form a composite coating of intermixed ink and powder. Coating thicknesses attainable by this process typically lie between 10 and 30 $\mu$m.

Thermographic printing is used in the graphic arts for achieving a raised print effect. Ink is printed, usually by offset lithography, and the printed sheets are then passed through a powdering machine where powder is applied and fused onto the printed areas. This process can generally be carried out much faster than screen printing, which is an alternative method to obtain raised prints on the order of 25 $\mu$m in thickness.

I have concluded that thermographic printing has potential advantages over screen printing in the manufacture of printed circuits due to the higher speed capability as compared with the screen printing methods presently employed in the manufacture of printed circuits. Further, thermographic printing is desirable due to the capability of producing patterns with narrower printed lines and spaces as compared with screen printing, which capability is essential in advanced printed circuit technology. Furthermore, the life of parts employed in thermographic printing, e.g., printing plate and blanket life, would be orders of magnitude greater than screen life. I have also found that thermographic coatings suitable for printed circuit manufacture can be made using solvent-free, low-cost inks and powders. The ability to employ solvent-free inks which are strippable by alkali solutions rather than organic solvents is of great importance in today's environmentally concerned society and in order to best meet governmental environmental regulations.

Consequently, it is desirable to develop materials and processes for thermographic etch and plating resists and solder masks for use in manufacturing printed circuit boards and other applications involving thermographic printing, which are strippable preferably without or with a minimal amount of organic solvents and which do not contain solvents in the ink. These materials and processes should also have the ability of being printable with normal printing techniques such as offset lithography, have adequate mechanical and chemical properties while resident on the substrate and should be removable at low cost. To be suitable for printed circuit manufacture, the ink should preferably be printable by dry offset printing to a typical printed thickness in the order of about 3 $\mu$m. The powder should be free flowing in the particulate state and be compatible with the ink holding it. After baking, preferably at temperatures under 150° C., the composite coating must cover completely the area to be protected and must be non-spreading so as to maintain fine line integrity. The coating should be adherent and strong enough to resist scratching and blocking during normal handling (blocking is the sticking together of two printed surfaces when pressed together at ambient temperature). Furthermore, the coating should have sufficient chemical resistance and not contaminate the plating or etching solution.

The use of powdered resin to cure solvent-free inks is generally known in the art. Among these are anti-offset powders which coat the entire printed surface and thereby provide spacing between adjacent printed sheets as described in U.S. Pat. No. 2,110,219. Also, the use of resin powders in thermographic printing processes has been described in U.S. Pat. No. 3,911,160. In the latter patent, the ink employed is either a drying oil vehicle ink, a drying oil alkyd ink, a resin-modified drying oil ink, gum rosin or tall oil rosin ink, a mineral oil or petroleum oil ink or an epoxy, polyurethane or polyamide modified ink. The inks described in this patent can be dried in the absence of powdered resin and the powdered resins utilized in combination with the inks may not give rise to a combination in which the resin is soluble in the ink as opposed to any organic solvent used in combination therewith. The requirement for an ink-powder combination useful in the manufacture of printed circuit boards is substantially more stringent than for many other general thermographic printing applications. One reason for this is the necessity of obtaining fine line spacing between adjacent lines on thermographic offset printed patterns for printed circuit boards, using ink-powder combinations which are strippable. This at least adds the requirement that the powder-ink combination cannot substantially spread during the heating operation so that fine-line differentiation such as a 15 mil or narrower line with 15 mil or narrower spacings can be maintained.

SUMMARY OF THE INVENTION

A thermographic printed strippable resist comprises a hydrophobic combination of a solvent-free, tacky, non-dryable ink and a compatible powdered resin wherein the ink is a primary plasticizer for the powdered resin.

The novel resist is formed by applying the ink to a surface, preferably in a predetermined pattern, dusting the powdered resin over the surface, removing, such as by vacuum means, the resin powder not retained by the ink from the surface, and heating the substrate having the ink-powder thereon to a temperature so as to fuse the powdered resin to form a strippable resist.

The aforementioned method for forming a strippable resist can be incorporated in and used as part of a method for manufacturing of printed circuit boards.

DETAILED DESCRIPTION

The present invention will be discussed primarily in terms of stripping a thermographically printed strippable resist comprising a solvent-free, tacky, non-drying ink and a fused powdered resin wherein the ink is a primary plasticizer for the powdered resin. Moreover, the invention will be discussed in terms of using such a strippable resist in the manufacture of printed circuit boards. It will be readily appreciated that the inventive concept is equally applicable to the formation of and stripping of the novel resist on surfaces other than printed circuit boards, provided such surfaces are chemically compatible with the ink and powdered resin. It will also be appreciated that the ink may be printed in a blanket fashion, as opposed to the patterned fashion, as will be described with reference to the manufacture of printed circuit boards, and any conventional printing technique such as lithography, wet or dry offset, letterset, letterpress or other techniques, may be used to apply the ink prior to dusting with the powder. The materials suitable as inks in the present invention are not inks in the conventional sense in that they are non-dryable.

It has now been discovered that thermographic printed strippable resists that are hydrophobic and which comprise a solvent-free, low-molecular weight resin ink and a fused powdered resin wherein the ink is a primary plasticizer for said resin gives superior resists for use in printed circuit board manufacturing applications. These resists generally possess good mechanical and chemical properties for use in printed circuit board manufacture while resident on the substrate and are removable at a relatively low cost often without the use of organic solvents, e.g., by stripping with alkali solutions or with the use of aqueous alkali solutions containing a minor proportion of an organic solvent. The ink portion of the resist is typically printable by dry offset printing, is fusible with the powder at temperatures of 150° C. or less without substantial spreading of the ink pattern and after baking, the composite ink-fused resin coating completely covers the area to be protected. The coating is adherent and strong enough to resist scratching and blocking during normal handling. Furthermore, the coating has sufficient chemical resistance not to contaminate the plating or etching solution used in forming the printed circuit board and meets the requirements as previously set forth. The resist can be formed at high speed and is capable of reproducibly being put down to form patterns with narrower printed lines and spaces than that presently attainable by methods such as screen printing.

Suitable ink-powder resin combinations include low molecular weight liquid thermoplastic resin inks in combination with a high molecular weight solid powdered resin of the same or similar, or different resin formulation wherein the ink acts as a plasticizer for the powdered resin. The ink itself is tacky and non-drying. The powdered resin may be thermoplastic or thermosetting or may be one which becomes thermosetting upon curing when combined with additives in the powder resin. The term "similar type polymers" as used herein means either polymers which differ only in molecular weight as well as polymers which may also differ in chemical formulation but fall into the same general class of chemical compounds. For example, various acrylics, methacrylicss and acrylic (methacrylic) copolymers are all similar polymers in accordance with this terminology. Also, all polyesters are similar type polymers, although not similar to acrylics or polystyrenes.

Ink-resin combinations include combinations wherein the ink and powder are different molecular weight resins of the same or similar polymers, the ink being a low-molecular weight liquid polymer which acts as a plasticizer for a higher molecular weight resin powder. Alternatively, the resin powder can be of a different polymer than that of the ink provided the ink is a plasticizer for that polymer. While the powder resin is generally a thermoplastic material, thermosetting powders are also suitable and may in some instances be preferred.

Examples of suitable ink-powder resin combinations include:

A low-molecular weight liquid polystyrene ink with a polystyrene powder resin;

A liquid polyester ink with a polyester powder resin;

A liquid acrylic ink with an acrylic powder resin;

A liquid acrylic ink with a polyester powder resin;

A liquid polystyrene-chlorowax ink with an acrylic powder resin;

A viscous acrylic resin-polyester ink with a polyester powder resin; and

A liquid polystyrene ink with a cyclized rubber powder resin. These examples are merely representative of suitable ink-powder combinations and are not exhaustive of such combinations.

The ink formulation may contain additives to the liquid resin plasticizer such as viscosity and flow controlling agents, tack modifiers and pigments.

For example a typical polystyrene ink may comprise: a low molecular weight, non-drying, liquid polystyrene resin such as Hercules Piccolastic A-5; a cyclized rubber and hydrocarbon resin tackifier such as Superior 3930 gel; a carbon black pigment such as Pope BH653 Pyroclean Black; and a leveling agent such as Monsanto Modaflow. A typical resin powder used in conjunction with this ink is a polystyrene resin such as Hercules Piccolastic D-125 having an average molecular weight of about 5000 or a high impact, higher molecular weight polystyrene such as Dow Styron. Typically the particle size of the powder resins are predominantly from 20 $\mu$m to 50 $\mu$m.

It should be understood that the particular ink formulation depends upon the resin powder and the mechanical and physical requirements of the resist.

Printed wiring boards may be formed by combining the steps of thermographic printing with known techniques for the manufacture of such boards. For example, the printed wiring board can be made from a substrate having a copper laminate over at least one surface thereof by well known subtractive techniques of etching selected areas of copper from the board. More particularly, a thermoplastic ink is first printed on the substrate in accordance with a predetermined pattern which is a positive of a desired circuit pattern; powdered resin is dusted on the substrate; excess, non-adherent powder is removed; the substrate is heated to fuse the powdered resin ink combination to form a strippable resist; the substrate is treated so as to etch away exposed copper not protected by the resist; the substrate is cleaned and the resist is stripped therefrom.

Alternatively, since the novel thermographic strippable resists are generally hydrophobic, additive processing for forming a printed circuit on a bare dielectric substrate can easily be performed. In accordance with additive processing, the substrate is preferably first treated to render it hydrophilic. The resist pattern is then formed on the substrate as previously described. In this case, however, the resist pattern is a negative of the desired circuit pattern. After forming the hydrophobic resist pattern, the substrate is treated so as to catalyze the exposed surface of the substrate not protected by the resist and subsequently treating the catalyzed substrate with an electroless plating bath so as to form an electroless metal deposit over the catalytic layer in accordance with the desired circuit pattern. If desired, additional metal can be deposited by electroplating techniques. The steps of catalysis and electroless plating and electroplating are well known in the printed wiring board art and essentially any of the known compositions and processes can be used. Reference can be made for example to U.S. Pat. Nos. 3,955,024; 3,791,340 and 4,107,837, to name but a few patents teaching catalyzing and plating solutions and processes. Finally, the resist may be stripped from the substrate (before or after electroplating) leaving only the desired metal conductive pattern on the substrate. Further semi-additive processing can be employed using this resist as well. By this method one proceeds as in subtractive processing but the copper layer here is thin and copper and solder are built up in the pattern not covered by resist. The resist is then stripped and the underlying thin copper is then etched away.

EXAMPLE I

Printing of inks on substrate panels 6"×4"×1/16" and 24"×12"×1/16" having one ounce of copper laminated to at least one side of an epoxy-glass core material has been accomplished using flat bed dry offset printing presses. Ink is first applied to inking rollers and then transferred to a printing plate having a circuit pattern thereon and finally to the substrate in accordance with the desired pattern. The substrate is then conveyed to a dusting apparatus, e.g., a Virkotype V12 raised printing machine, where resin powder is sprinkled onto the panels from a hopper and excess powder is vacuumed off and returned to the hopper. Any remaining, non-adhering powder is blown off the panel. Panels were then baked in convection ovens for times and temperatures to cause the powder to fuse without substantial spreading. Typically, times of about 10 minutes at temperatures of from about 125°–150° C. are suitable. Actual times and temperatures vary with the specific formulation.

The substrate having the resist pattern thereon is then treated with an etching solution. Any copper etchant is suitable. A typical etchant is a ferric chloride etchant available as Hunt Hi Speed Etch which is sprayed on the substrate at elevated temperatures, typically from 25°–55° C. After etching is complete, the substrate is rinsed and placed in a stripping solution for stripping the resist, thereby exposing the underlying copper circuit pattern. For alkali strippable resists, stripping is typically carried out by immersion in a warm dilute (3–25%) NaOH solution at 30°–50° C. for several minutes. Alternatively, depending upon the resist formulation, stripping may be carried out by means of a suitable solvent. Another preferred stripping method is applying the stripping agent, e.g., 3–5% NaOH with 4–10% butyl cellosolve in water by spraying at temperatures of from about 40°–60° C. under a pressure of about 35 psi.

A. The above process was carried out employing an ink formulation consisting of:

| Constituent | % by Weight |
|---|---|
| Hercules Piccolastic A-5 Polystyrene | 68.0–79.5 |
| Superior 3930 gel | 15.0–23.0 |
| Pope BH653 Pyroclean Black | 5.0–8.0 |
| Monsanto Modaflow | 0.5–1.0 | with a resin powder consisting of Hercules Piccolastic D-125 polystyrene. The resist was stripped with a warm 1,1,1 trichloroethane in a conveyorized spray stripper. Typically, stripping times were 1–2 minutes.

B. The process set forth above was carried out employing an ink consisting of:

| Constituent | % by Weight |
|---|---|
| Hercules Piccolastic A-25 Polystyrene | 50 |
| Diamond Shamrock Chlorowax 40 (32 poise, molecular weight 560) | 40 |
| Phthalocyanine blue pigment | 10 | with a 20–50 μm resin powder consisting of isobutyl methacrylate, e.g., Rohm & Haas Acryloid B67. The resist is stripped with warm 1,1,1-trichloroethane or methylene chloride. The resist of this formulation is hard, tough and scrape resistant.

C. The same ink formulation as used in Example I-B above is combined with a methyl/butyl methacrylate copolymer resin powder, e.g., Rohm & Haas Acryloid B66. The resist of this formulation is hard, tough and scrape resistant.

D. The same process was repeated using an ink consisting of an alkali soluble liquid methacrylic acid/methacrylate copolymer ink, e.g., Goodrich Carboset 515, modified with 40% tricresyl phosphate to reduce viscosity and tack, with an alkali soluble resin powder consisting of Goodrich XL-27, a high molecular weight copolymer of methacrylic acid and methacrylate. This resist is readily strippable with warm alkali solution.

E. The same process and ink formulation as set forth in Example I-D was combined with a resin powder consisting of alkali strippable esterified styrene-maleic anhydride copolymer, e.g., Arco SMH 2625.

F. The above-described process was repeated employing an ink-powder resin combination consisting of a polyester ink such as Rohm & Haas Paraplex Polyester Plasticizers G41, G56 or G59, with a gloss thermosetting polyester resin powder such as Sherwin Williams N-20. The resulting resist when properly baked to cause cross linking is resistant to dilute alkali, ph<9, but is strippable using a solution consisting of 3–5% NaOH with 4–10% butyl cellosolve in water. Resists of this formulation are hard, tough and scrape resistant.

What is claimed is:

1. A method of forming a strippable resist comprising:
   (a) applying a solvent-free, non-dryable ink to a substrate;
   (b) applying a powdered resin over said substrate, said resin adhering to those areas of said substrate having ink applied thereto, said powdered resin being related to said ink in that said ink is a primary plasticizer for said powdered resin;
   (c) removing excess powdered resin not retained by said ink from the surface of said substrate; and
   (d) heating the substrate to a temperature so as to fuse said powdered resin to form a strippable resist.

2. The method recited in claim 1 wherein said substrate is a printed circuit board blank.

3. The method recited in claim 1 wherein said substrate is heated at temperatures from 120°C.–150° C. for times suitable for fusing said powdered resin-ink without causing substantial spreading thereof.

4. The method recited in claim 1 wherein said ink is applied by dry offset printing.

5. The method recited in claim 1 wherein said powdered resin is applied to said substrate by dusting.

6. The method recited in claim 1 wherein said ink is applied in a defined pattern on said substrate.

7. The method recited in claim 1 including the step of stripping said resist from said substrate.

8. The method recited in claim 1 wherein said ink and said powdered resin are comprised of a similar type polymer.

9. The method recited in claim 1 wherein said resist is thermoplastic.

10. The method recited in claim 1 wherein said resist is thermosetting.

11. The method recited in claim 1 wherein said resist is strippable with an alkali solution.

12. The method recited in claim 1 wherein said ink and said powdered resin forming said resist are of a similar polymer type.

13. The method recited in claim 12 wherein both said ink and said resin are polystyrene polymers.

14. The method recited in claim 13 wherein both said ink and said powdered resin are polyester polymers.

15. The method recited in claim 12 wherein said ink and said powdered resin are acrylic polymers.

16. The method recited in claim 1 wherein said ink and said powdered resin forming said resist are of different polymer types.

17. The method recited in claim 16 wherein said ink is a liquid polystyrene polymer and said powdered resin is an acrylic polymer.

18. The method recited in claim 17 wherein said polystyrene ink further contains chlorowax.

19. The method recited in claim 16 wherein said ink is an acrylic polymer and said powdered resin is a polystyrene resin.

20. A method of manufacturing a printed circuit board comprising:
(a) printing in a predetermined pattern a solvent-free, non-dryable ink on the surface of a metal-clad laminate;
(b) applying a powdered resin over the surface of said laminate;
(c) removing powdered resin not retained by said ink from the surface of said laminate;
(d) heating said laminate to a temperature so as to fuse said powdered resin to form a strippable resist; and
(e) etching said laminate to remove the metal from said laminate in areas not coated by said resist.

21. The method of manufacturing a printed circuit board as recited in claim 20 including the step of stripping said resist subsequent to etching.

22. The method recited in claim 20 wherein said resist is thermoplastic.

23. The method recited in claim 20 wherein said resist is thermosetting.

24. The method recited in claim 21 wherein said resist is strippable with an alkali solution.

25. The method recited in claim 20 wherein said ink and said powdered resin forming said resist are of a similar polymer type.

26. The method recited in claim 25 wherein both said ink and said resin are polystyrene polymers.

27. The method recited in claim 25 wherein both said ink and said powdered resin are polyester polymers.

28. The method recited in claim 25 wherein said ink and said powdered resin are acrylic polymers.

29. The method recited in claim 20 wherein said ink and said powdered resin forming said resist are of different polymer types.

30. The method recited in claim 29 wherein said ink is a liquid polystyrene polymer and said powdered resin is an acrylic polymer.

31. The method recited in claim 30 wherein said polystyrene ink further contains chlorowax.

32. The method recited in claim 29 wherein said ink is an acrylic polymer and said powdered resin is a polystyrene resin.

33. A method of manufacturing a printed circuit board comprising:
(a) printing in a predetermined pattern a solvent-free, non-dryable ink on a dielectric substrate;
(b) applying a powdered resin over the surface of said substrate;
(c) removing powdered resin not retained by said ink from the surface of said substrate;
(d) heating said substrate to a temperature so as to fuse said powdered resin to form a strippable resist;
(e) catalyzing the surface not coated with resist; and
(f) electrolessly plating a metal coating on said catalyzed surface.

34. A method of manufacturing a printed circuit board comprising:
(a) printing in a predetermined pattern a solvent-free, non-dryable ink on a laminated substrate which comprises a thin metallic film on a dielectric base;
(b) applying a powdered resin over the surface of said laminate;
(c) removing powdered resin not retained by said ink from the surface of said laminate;
(d) heating said laminate at a temperature so as to fuse said powdered resin-ink to form a strippable resist;
(e) plating additional metal on said substrate in areas not coated with said resist;
(f) applying a solder layer over said plated areas;
(g) stripping said resist; and
(h) etching away the metal which was underlying said resist.

* * * * *